United States Patent
Gramse et al.

(10) Patent No.: US 7,730,609 B2
(45) Date of Patent: Jun. 8, 2010

(54) METHOD AND APPARATUS FOR CARRYING CIRCUIT ASSEMBLIES

(75) Inventors: Leonard J. Gramse, St. Paul, MN (US); Houn Sang, Blaine, MN (US); Dean A. Waskosky, Plymouth, MN (US); Matthew D. Toyli, Fridley, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 0 days.

(21) Appl. No.: 12/051,594

(22) Filed: Mar. 19, 2008

(65) Prior Publication Data

US 2008/0165512 A1 Jul. 10, 2008

Related U.S. Application Data

(62) Division of application No. 11/064,177, filed on Feb. 23, 2005, now Pat. No. 7,352,592.

(60) Provisional application No. 60/573,481, filed on May 21, 2004.

(51) Int. Cl.
| | |
|---|---|
| *H05K 3/36* | (2006.01) |
| *H05K 3/20* | (2006.01) |
| *H05K 1/16* | (2006.01) |
| *H05K 1/11* | (2006.01) |
| *H01R 12/04* | (2006.01) |
| *H01R 13/62* | (2006.01) |

(52) U.S. Cl. .................. 29/830; 29/831; 174/260; 439/152

(58) Field of Classification Search .......... 29/830, 29/831, 832, 834, 854; 174/260, 261; 439/152
See application file for complete search history.

(56) References Cited

U.S. PATENT DOCUMENTS

| | | | |
|---|---|---|---|
| 4,007,479 A | 2/1977 | Kowalski | |
| 4,278,311 A | 7/1981 | Scheingold | |
| 4,547,794 A | 10/1985 | Tang | |
| 4,949,159 A | 8/1990 | Petry, Jr. et al. | |
| 5,067,648 A | 11/1991 | Cascini | |
| 5,278,447 A | 1/1994 | Vongfuangfoo et al. | |
| 5,401,187 A | 3/1995 | Ortega | |
| 5,603,629 A | 2/1997 | DeFrasne et al. | |
| 5,713,744 A | 2/1998 | Laub | |
| 5,785,307 A | 7/1998 | Chung | |
| 5,972,152 A | 10/1999 | Lake et al. | |
| 6,075,706 A | 6/2000 | Learmonth et al. | |

(Continued)

*Primary Examiner*—A. Dexter Tugbang
*Assistant Examiner*—David P Angwin
(74) *Attorney, Agent, or Firm*—Schwegman, Lundberg & Woessner, P.A.

(57) ABSTRACT

An apparatus for a circuit assembly, including two plates which are adapted to hold a circuit assembly, connected by a hinge, and including a hold-down adapted to interlock the circuit assembly to a plate, and a sliding lock adapted to secure the plates. Examples of the present subject matter include embodiments wherein the sliding lock secures the first plate and second plate in a first mode of operation, and releases the first plate in a second mode of operation, and wherein the hold-down interlocks the circuit assembly to the first plate in a first state of operation, and interlocks the circuit assembly to the second plate in a second state of operation. Further, the present subject matter includes a method for using a circuit carrier to hold a circuit assembly.

20 Claims, 10 Drawing Sheets

U.S. PATENT DOCUMENTS

| | | |
|---|---|---|
| 6,099,337 A | 8/2000 | Chan |
| 6,106,317 A | 8/2000 | Michaelis et al. |
| 6,109,976 A | 8/2000 | Van Zanten et al. |
| 6,116,933 A | 9/2000 | Willhite |
| 6,164,636 A | 12/2000 | Taylor |
| 6,378,857 B1 | 4/2002 | Taylor |
| 6,462,958 B2 | 10/2002 | Ogata |
| 6,471,550 B2 | 10/2002 | Maiterth et al. |
| 6,505,665 B1 | 1/2003 | Ulmer et al. |
| 6,733,339 B2 | 5/2004 | Casey |
| 6,757,172 B2 | 6/2004 | Maruyama |
| 6,761,575 B2 | 7/2004 | Bricaud et al. |
| 2002/0135993 A1* | 9/2002 | Ueyama et al. .............. 361/814 |
| 2003/0022537 A1* | 1/2003 | Bricaud et al. .............. 439/152 |

* cited by examiner

METHOD AND APPARATUS FOR CARRYING CIRCUIT ASSEMBLIES

CLAIM OF PRIORITY AND RELATED APPLICATION

This application is a divisional of U.S. patent application Ser. No. 11/064,177, filed Feb. 23, 2005, now issued as U.S. Pat. No. 7,352,592, which is incorporated herein by reference in its entirety.

This application claims the benefit under 35 U.S.C. 119(e) of U.S. Provisional Patent Application Ser. No. 60/573,481, filed May 21, 2004, the entire disclosure of which is hereby incorporated by reference in its entirety.

TECHNICAL FIELD

This disclosure relates generally to electronic circuit assemblies, and more specifically, to a carrier used for holding a circuit assembly.

BACKGROUND

Electronic circuitry consistently becomes increasingly sophisticated. New electrical circuit boards are more complex and more compact than prior designs. For example, many modern circuit assemblies include more functionality per unit of volume than older designs. New technologies, such as smaller components, or new manufacturing methods, are often used to produce smaller or more complex designs.

One group of devices which benefit from increased functionality per unit volume is implantable cardiac defibrillators ("ICDs"). ICDs are used to promote cardiac wellness in humans. Patients with irregular heart rhythms have had defibrillators implanted in their bodies, typically near their hearts. These devices detect cardiac wellness and apply corrective electrical therapy, including one or more bursts of electric current. ICDs are able to deliver more sophisticated therapies by using sophisticated electrical circuitry. Additionally, ICDs provide less patient discomfort when they are smaller. Because of this, devices using compact circuitry have been designed.

However, designs which include more electrical circuitry per unit volume often utilize new technologies, such as flexible circuitry, which can be more fragile when used in existing manufacturing processes. Additionally, designs which are more densely populated with components exhibit increased vulnerability to damage. Further, processes which move circuitry from one step to another often require the use of multiple fixtures. Repeatedly using fixtures to hold a circuit assembly increases the potential for mishandling.

As such, there is a need in the art for a method and apparatus to transport circuitry which reduces the potential for handling damage without reducing the ability to work with the circuitry.

SUMMARY

The above-mentioned problems and others not expressly discussed herein are addressed by the present subject matter and will be understood by reading and studying this specification.

In various embodiments, the present subject matter relates to an apparatus for a circuit assembly having a first side and a second side, and including a first plate adapted to hold the first side of the circuit assembly and including a first hinge mount, a second plate adapted to hold the second side of the circuit assembly and including a second hinge mount, a hold-down adapted to interlock the circuit assembly to one of the first plate and the second plate, a sliding lock adapted to secure the first plate to the second plate, and a hinge connected to the first hinge mount and the second hinge mount. Additionally, in various embodiments, the present subject matter includes embodiments wherein the sliding lock secures the first plate and second plate in a first mode of operation, and releases the first plate in a second mode of operation, and wherein the hold-down interlocks the circuit assembly to the first plate in a first state of operation, and interlocks the circuit assembly to the second plate in a second state of operation.

The present subject matter also includes a method for a circuit assembly having a first side and a second side, including connecting a first plate to a second plate with a hinge, using a first plate to hold a first side of the circuit assembly, using a hold-down to interlock the circuit assembly to the first plate in a first mode of operation, and using the hold-down to interlock the circuit assembly to the second plate in a second mode of operation. Additionally, in various embodiments, the present subject matter includes mating the first plate and the second plate and using a lock to secure the first plate to the second plate in a first state of operation, and to release the second plate in a second state of operation.

This Summary is an overview of some of the teachings of the present application and not intended to be an exclusive or exhaustive treatment of the present subject matter. Further details about the present subject matter are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

DETAILED DESCRIPTION

The following detailed description of the present invention refers to subject matter in the accompanying drawings which show, by way of illustration, specific aspects and embodiments in which the present subject matter may be practiced. These embodiments are described in sufficient detail to enable those skilled in the art to practice the present subject matter. It will be apparent, however, to one skilled in the art that the various embodiments may be practiced without some of these specific details. References to "an", "one", or "various" embodiments in this disclosure are not necessarily to the same embodiment, and such references contemplate more than one embodiment. The following detailed description is, therefore, not to be taken in a limiting sense, and the scope is defined only by the appended claims, along with the full scope of legal equivalents to which such claims are entitled.

Figure 1:
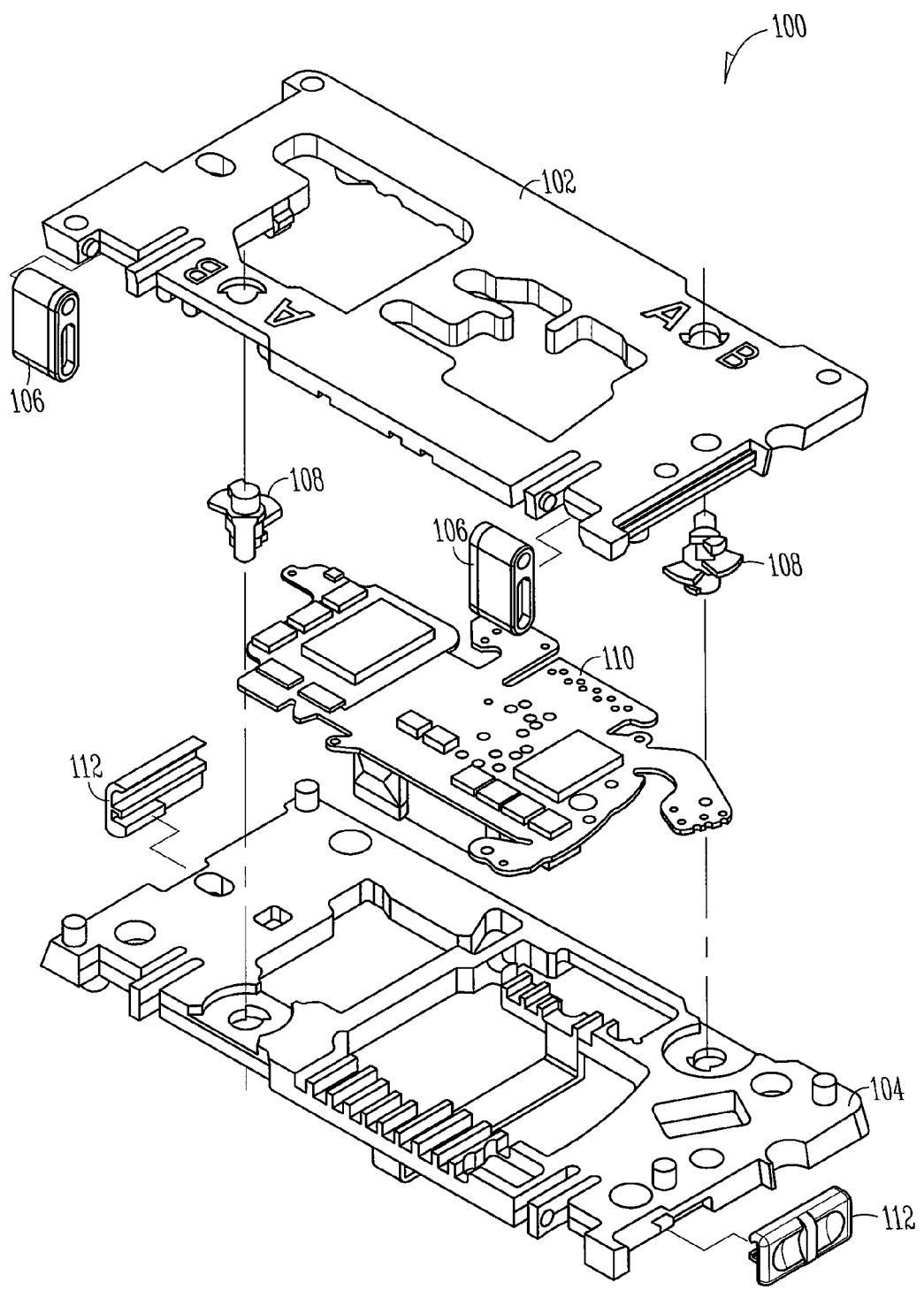
FIG. 1 illustrates an exploded view of a circuit carrier and a circuit assembly, according to one embodiment of the present subject matter.

FIG. 1 illustrates an exploded view of a circuit carrier 100 and a circuit assembly, in one embodiment of the present subject matter. In various embodiments, the circuit carrier 100 includes a first plate 102, a second plate 104, at least one hinge 106 connecting them, at least one circuit hold-down 108 adapted to interlock the circuit assembly 110 to one of the first plate 102 and the second plate 104, and at least one clasp 112 adapted to secure the first plate to the second plate. In various embodiments, circuit assembly 110 includes rigid circuit assemblies, flexible circuit assemblies, or combinations thereof.

Figure 2:
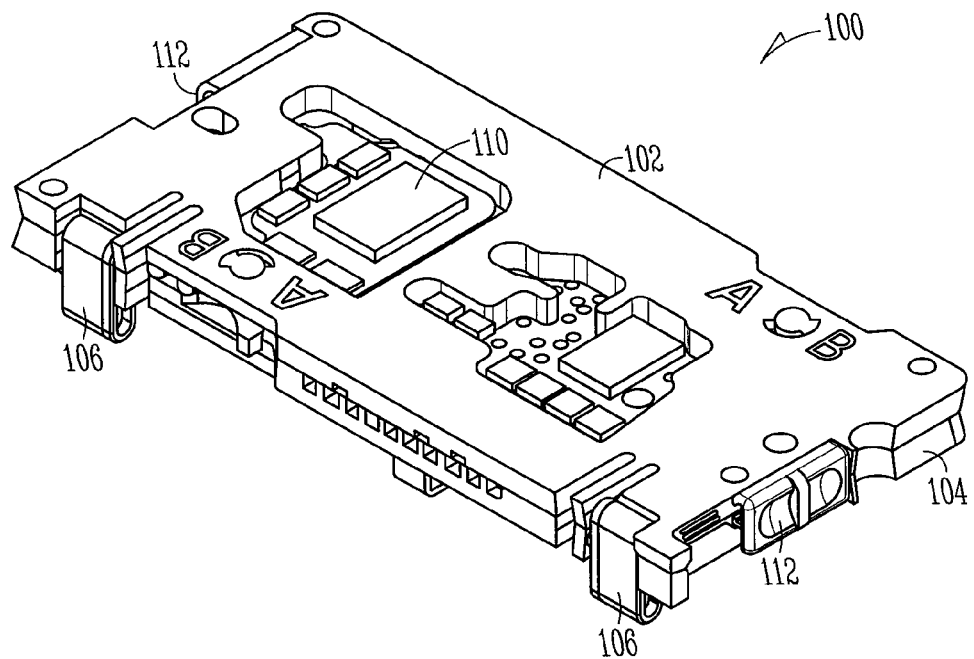
FIG. 2 illustrates a circuit carrier and a circuit assembly, according to one embodiment of the present subject matter.

FIG. 2 illustrates a circuit carrier 100 and a circuit assembly 110, in one embodiment of the present subject matter. In various embodiments, the first plate 102 and the second plate 104 are sandwiched together, with a circuit assembly 110 disposed between the first plate 102 and the second plate 104. In some examples, a clasp 112 and a hinge 106 work in conjunction to secure the first plate 102 and the second plate 104. In various embodiments, the circuit carrier servers to absorb forces from external objects which might otherwise directly contact the circuit assembly and damage it.

Figure 3:
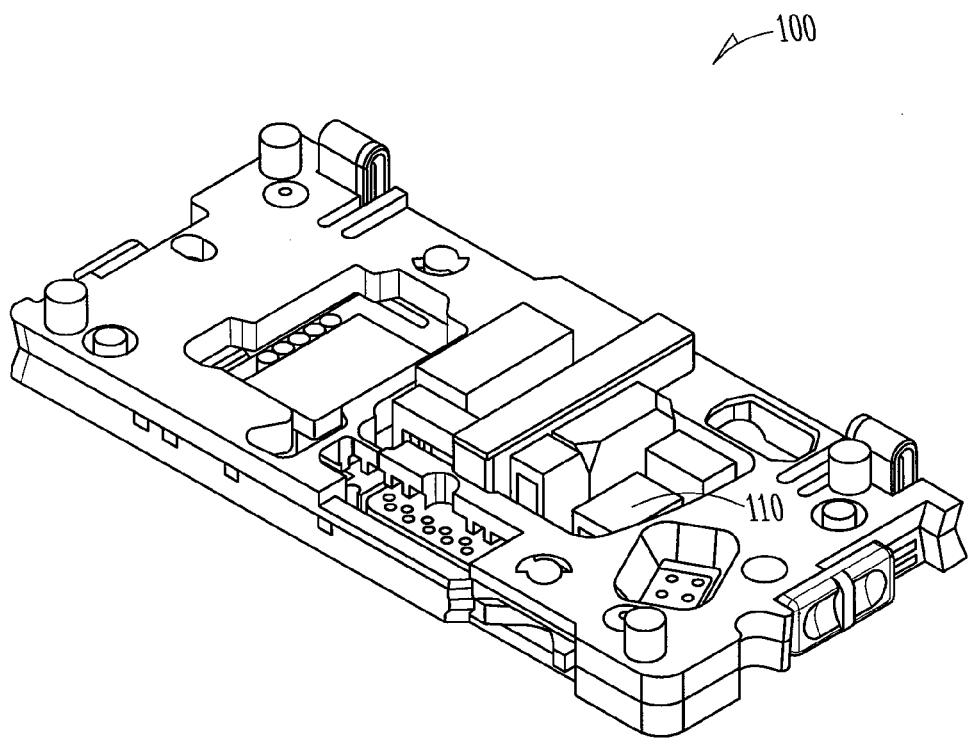
FIG. 3 illustrates a circuit carrier and a circuit assembly, according to one embodiment of the present subject matter.

FIG. 3 illustrates a circuit carrier 100 and a circuit assembly 110, in one embodiment of the present subject matter. The figure illustrates an additional view of the circuit carrier 100.

Figure 4:
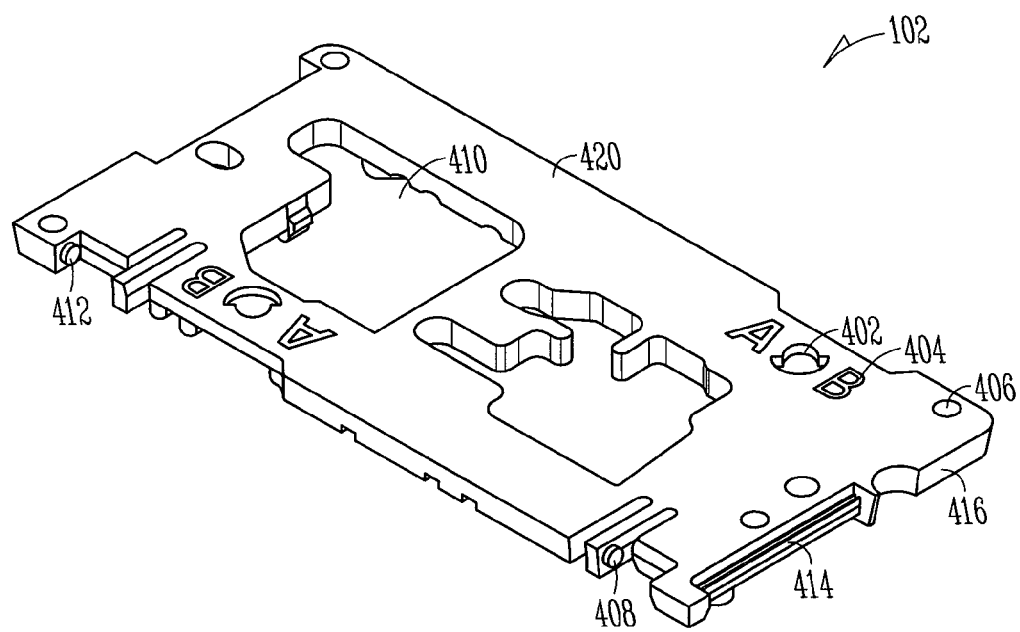
FIG. 4 illustrates a perspective view of the top of a plate component to a circuit carrier, according to one embodiment of the present subject matter.

FIG. 4 illustrates a perspective view of the top of a plate 102 for a circuit carrier, in one embodiment of the present subject matter. In various embodiments, a circuit carrier uses a plate 102 which is substantially planar. Various embodiments of the plate 102 include features which perform various functions. For example, in one embodiment, the plate 102 includes features adapted to mate with a circuit assembly. Varying embodiments, for example, include depressions which match with raised portions on a circuit assembly. One example includes features adapted to protect portions of a flexible circuit assembly from being cut. Other features also exist within the scope of the present subject matter, and the limitations listed here are not intended to be exhaustive or exclusive of the present subject matter.

Various embodiments of the plate 102 include at least one aperture 410. In various embodiments, an aperture 410 is adapted for exposing portions of a circuit. One example exposes portions of a circuit assembly so that the circuit assembly may be welded or inspected. Various examples also expose portions of a circuit assembly for additional operations, such as crimping components to the circuit assembly. Other manufacturing steps also use the at least one aperture 410, and those uses enumerated here are not provided in a limiting sense.

Varying embodiments of the plate 102 include an interface adapted for receiving a hold-down. In some embodiments, a plate with an interface adapted to receive a hold-down includes features which form a recess 402. In various embodiments, the recess 402 is formed in part by a recess connected to a keyed passage. Various embodiments of the recess 402 are designed to mate to a keyed hold-down. Some examples are designed to allow a keyed hold-down to rotate after mating to the recess 402. Additional embodiments allow rotation while constraining the hold-down to the plate 102. In one embodiment, the recess 402 includes a stop which is adapted to limit rotation of a keyed hold-down after the hold-down has been mated to the interface.

Varying embodiments also provide for a lock or for tactile feedback which indicates to the user what position the hold-down is in. In one example, a lock prevents the hold-down from moving relative to the recess 402. For example, in one embodiment, the recess 402 includes a depression, and the hold-down a compatible raised member, such that the raised member mates to the depression and resists further movement of the hold-down relative to the recess 402. However, in some embodiments, a predetermined force will suffice to force the hold-down or the recess 402, or both, to deform and allow further rotation of the hold-down.

Some examples of the plate 102 of the present subject matter include a boss 412. In various embodiments, the boss 412 is cylindrical, and adapted to mate with a compatible feature in a hinge. In one example, a similarly shaped socket is used for mating with the boss 412. In various embodiments, the fit between a plate and the socket is loose, and in others it is an interference fit, and it still others, it is tuned to provide a desired level of friction. Varying embodiments also include features in the boss which enable adjustment of the hinge, relative to the plate, in measured increments. For example, in some embodiments, the boss 412 includes at least one recess, and the mating feature on a hinge includes at least one raised feature compatible with each recess, such that rotation of the hinge requires the hinge or boss or both to elastically deform whenever the feature of the plate is not mated with a recess in the socket. This elastic deformation, in various embodiments, compels the hinge to come to rest in a position where the raised feature on the plate mates with a recess, in order to relieve the deformation. The overall result of using recesses in the boss 412, in various embodiments, enables predetermined incremental adjustment.

Various embodiments of the plate 102 of the present subject matter include a deformable member 408 adapted to connect to a hinge. In various embodiments, the deformable member 408 is an elongate member which includes a boss. In various embodiments, the boss is adapted to mate with a compatible feature in a hinge. For example, in one embodiment, the boss is adapted to mate with a similarly shaped socket in the hinge. In various embodiments, the fit between a plate and the socket is free, and in others it is an interference fit, and it still others, it is tuned to provide a desired level of friction. Varying embodiments also include features in the boss which enable adjustment of the hinge to the plate in measured increments, similar to that discussed above. For example, in some embodiments, the boss includes at least one recess, and the mating feature on a hinge includes at least one raised feature compatible with each recess, such that rotation of the hinge requires the hinge or boss or both to elastically deform whenever the feature of the plate is not mated with a recess in the socket.

In one example, the elongated member 408 allows for deformation stresses to be distributed along the length of the elongate member 408. This elastic deformation, in various embodiments, compels the hinge to come to rest in a position where the at least one raised feature on the plate mates with a recess, in order to relieve elastic deformation. The overall result of using recesses in the boss 408, in various embodiments, enables predetermined incremental adjustment.

In varying embodiments, the elongate member 408 is elastically deformed to connect a hinge. Further, in some embodiments, the elongate member 408 is adapted to conform to variations in plate alignment by flexing to compensate for dimensional variation. Some examples of the deformable member 408 provide for a safety release which disconnects a hinge when a predetermined force is applied. Various examples will not disconnect a hinge until a force is applied at a predetermined angle. Various examples include stress risers which are designed to provide for a controlled failure of the elongated member 408.

These are just examples of various embodiments of a plate, and these descriptions are not intended to be a complete list of the embodiments within the scope of the present subject matter. For example, in some embodiments, the hinge contains a boss, and the plate 102 contains a socket. Various combinations of hinges and bosses are also within the scope of the present subject matter.

Various embodiments of the plate of the present subject matter include features which form at least one opening 406. In various embodiments, an opening 406 may be used for alignment. For example, in one embodiment, at least two openings 406 are located in an asymmetrical fashion in a plate 102 and are adapted to mate to another plate. In various embodiments, by including mating features on the other plate, such as pegs, which are compatible with the openings 406, the plate 102 and the other plate can be assembled in only one way. In other embodiments, a set of openings 406 arranged in a symmetrical fashion are used. It should be noted that the scope of the present subject matter includes various shapes which can be used as openings 406, including cylindrical openings, rectangular openings, and other types of openings. It should also be noted that in various embodiments, an opening forms a passage through the plate 102. In further embodiments, a feature used for alignment, such as opening 406, is cup shaped.

Various embodiments of the present subject matter include markings 404 which are used for communicating information. For example, in one embodiment, the markings 404 are used to indicate what position a hold-down is in. In one example, markings 404 are used to coordinate the position of two hold-downs. Varying embodiments of a circuit carrying assembly will not allow the separation of two plates unless all the hold-down positions are coordinated. Markings 404, in various embodiments, enable a user to determine if all the hold-downs are in place. In various embodiments, a user can read markings 404 by looking at them. Also, varying embodiments use a machine to read the markings 404.

Some embodiments of the plate of the present subject matter include a clasp interface 414. In varying embodiments, the clasp interface 414 is adapted to mate with a slidable clasp. In some embodiments, the clasp moves in a manner which is not sliding. For example, in one embodiment, the clasp rotates. As such, in varying embodiments, the clasp interface 414 can include screw threads or a lock. In one embodiment, the clasp interface includes a wedge shaped member, which is adapted to provide increasing resistance as a clasp is moved to a locked position. Additional embodiments of the clasp interface 414 include features which are adapted to permanently connect to a clasp. In one embodiment, a clasp connects to a plate 102, and is movable while connected to the plate. The clasp can remain connected to plate 102 while not in use carrying a circuit assembly.

Further, in some embodiments, the clasp interface 414 includes features which provide locking and tactile feedback. For example, in one embodiment, the clasp interface 414 includes a series of ridges which are compatible with mating features on a clasp. In various embodiments, when a clasp is slid on the clasp interface 414 with a series of ridges, the user can detect motion by feeling incremental changes in position, or by hearing the sound created by the features of the clasp interface 414 moving into and out of a resting position with a clasp. Varying embodiments of the clasp interface 414 include a locking feature. In various embodiments, a locking feature is a notch in the clasp interface 414 designed to mate with a raised feature on a clasp. In one embodiment, the locking feature provides tactile feedback of lock engagement, and it includes an audible noise.

Various embodiments of the present subject matter rely on deformation of the clasp, the clasp interface 414, or both, in order to allow motion of the clasp relative to the clasp interface 414. In various embodiments, the clasp is plastic. However, it should be noted that other embodiments not enumerated here fall within the scope of the present subject matter.

Varying embodiments of the plate 102 include an exterior surface 420. In various embodiments, the interior surface is adapted to mate with the exterior surface of another plate. Additionally, in various embodiments, the plate 102 includes a perimeter surface 416. In one embodiment, the perimeter surface 416 includes a taper. Various embodiments including a taper allow a user to better manipulate the plate both individually and as part of a circuit assembly carrier.

In various embodiments, the plate 102 is plastic. However, it should be noted that other embodiments not enumerated here fall within the scope of the present subject matter.

Figure 5:
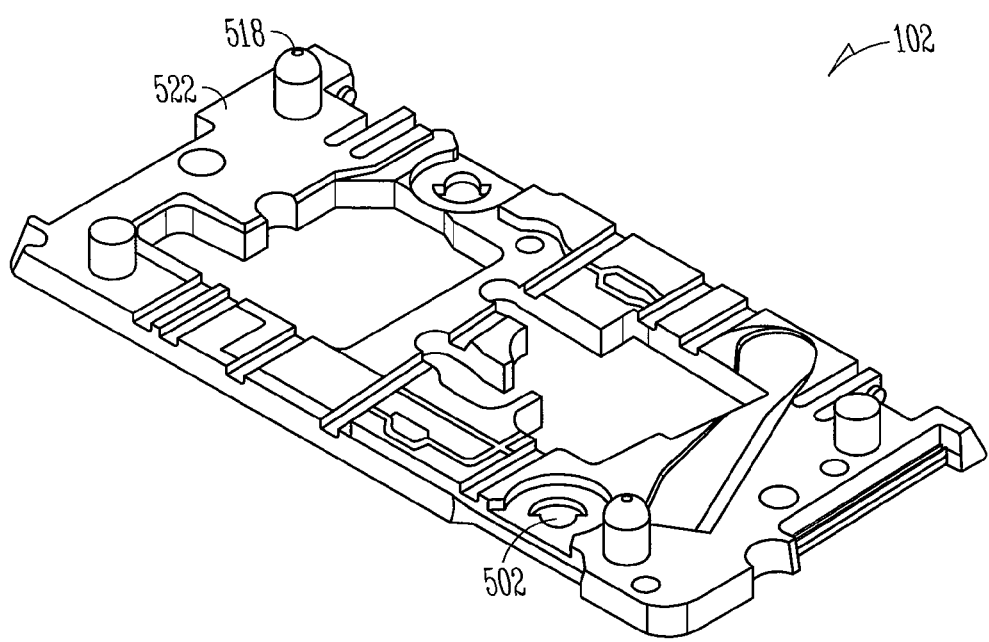
FIG. 5 illustrates a perspective view of the bottom of a plate component to a circuit carrier, according to one embodiment of the present subject matter.

FIG. 5 illustrates a perspective view of the bottom of a plate 102 for a circuit carrier, in one embodiment of the present subject matter. Various features of the plate 102 are described in the discussion of FIG. 4 and are incorporated here.

In one embodiment, the plate includes a peg 518. Varying embodiments use at least one peg 518 for registration, or spacing, or both. In embodiments which use the peg 518 for registration, a circuit carrier assembly includes at least two plates and at least one hinge. In various embodiments, the peg 518 is used to precisely align two plates. In one embodiment, the pegs are arranged in an asymmetrical fashion, such that the plates may only be mated in one manner. Additional embodiments use pegs which are symmetrically placed, allowing for the plates to be aligned in at least two ways.

In various embodiments of the present subject matter the pegs are approximately cylindrical, and in further examples they include a small taper. Various examples of pegs featuring a taper enable the plates to be mated accurately, even when the mating plates are initially misaligned. In one example, the taper of the peg 518 draws the plates into alignment as the plates are mated. Further embodiments include a peg 518 with a rounded tip. In various embodiments, a peg 518 with a rounded tip assists in fulfilling the various objectives of the peg, such as alignment or spacing.

Varying embodiments of the present subject matter use pegs which are capable of precision alignment. For example, in some embodiments, an assembly of at least two plates and at least one hinge is capable of obtaining a first level of dimensional precision, and the same assembly with pegs is capable of obtaining a second, improved level of dimensional precision.

In embodiments which use the peg 518 for spacing, there is no mating hole for the peg 518 to align to. Embodiments with use the peg 518 as a spacer include at least two plates, and at least one hinge, and when the plates are mated, the peg 518 provides for their precise spacing. In some embodiments, the peg 518 has a rubber tip to help absorb the shock created by mating plates. Additionally, a rubber tip can provide improved friction between the plate and the peg 518, which, in one example, decreases the movement of the plate to which the peg 518 is attached relative to another plate.

Various embodiments which do not use the peg 518 for spacing or alignment use the peg 518 for other purposes, such as legs for a circuit carrying assembly to rest on. For example, one embodiment of the circuit carrier includes a plate which includes a set of legs which extend beyond other features of the plate, allowing the circuit carrier with an uneven shape to rest in a stable manner on a flat surface.

Varying embodiments of the plate 102 include a hold-down interface. In some embodiments, a plate with a hold-down interface includes a recess 502. In various embodiments, the recess 502 is adapted to interface with a hold-down. Various embodiments of the recess 502 are designed to allow a keyed hold-down to mate with it. Some examples are designed to allow a keyed hold-down to further rotate after mating with the recess 502. In one embodiment, the interior portion 502 includes a stop which is adapted to limit rotation of a keyed hold-down after the hold-down has been mated to the interface.

Varying embodiments of the plate 102 include an interior surface 522. In various embodiments, the interior surface is adapted to mate with a circuit assembly.

Figure 6:
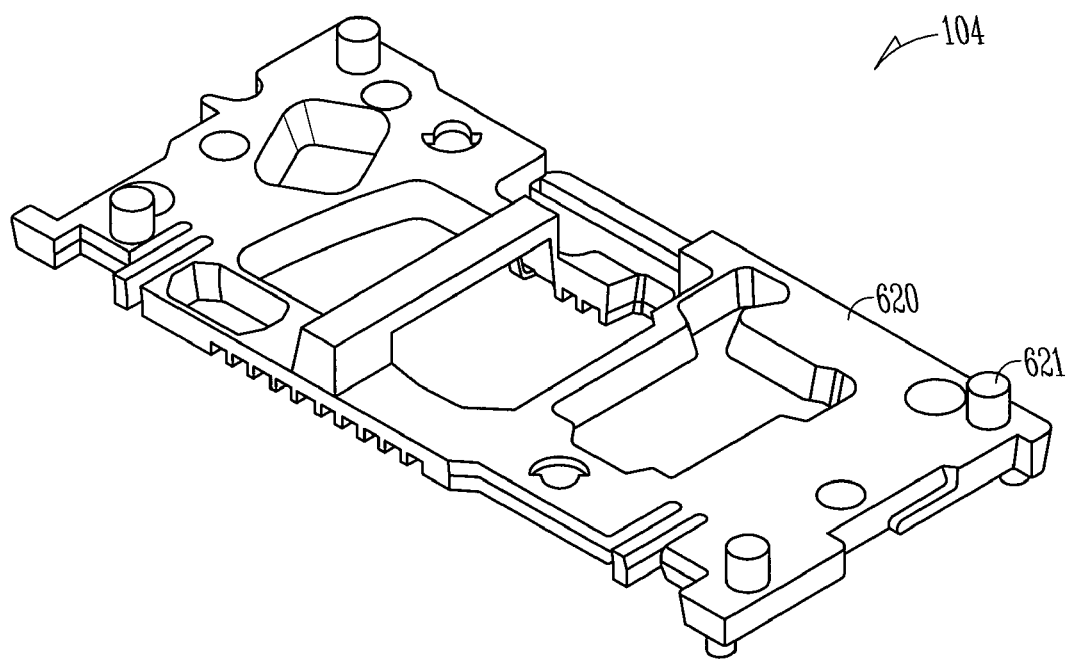
FIG. 6 illustrates a perspective view of the top of a plate component to a circuit carrier, according to one embodiment of the present subject matter.

FIG. 6 illustrates a perspective view of the top of a plate 104 for a circuit carrier, in one embodiment of the present subject matter. In various embodiments, the plate 104 is adapted to mate with the plate 102 illustrated in FIG. 4 and FIG. 5. Various features of the plate 104 are substantially similar to features included in the description of those figures, and are incorporated here by reference.

Various embodiments use the at least one peg 621 for stacking multiple circuit carrying assembles. For example, one embodiment of a circuit carrying assembly includes at least two plates and at least one hinge. Some examples of these embodiments mate the plates of a single circuit assembly carrier, and then stack multiple circuit assembly carriers unto one another. This can be useful whether or not a circuit assembly is disposed in the circuit carrier. In one example, stacking is accomplished by mating pegs 621 on a plate of a first circuit carrying assembly to openings on a plate of a second circuit carrying assembly. In further embodiments, this is accomplished by mating pegs 621 to other features. Various embodiments using pegs 621 for stacking may be stacked higher because of the use of pegs 621.

Varying embodiments of the plate 104 include an exterior surface 620. In various embodiments, the interior surface is adapted to mate with the exterior surface of another plate. In various embodiments, the plate 104 is plastic. However, it should be noted that other embodiments not enumerated here fall within the scope of the present subject matter.

Figure 7:
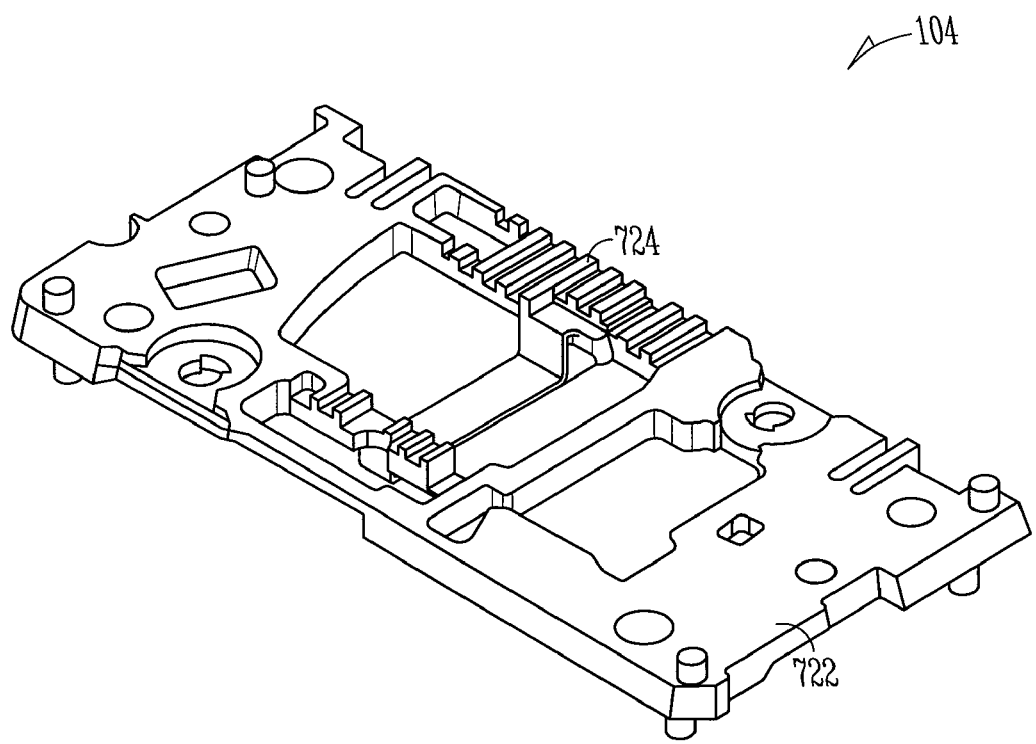
FIG. 7 illustrates a perspective view of the bottom of a plate component to a circuit carrier, according to one embodiment of the present subject matter.

FIG. 7 illustrates a perspective view of the bottom of a plate 104 for a circuit carrier, in one embodiment of the present subject matter. Various features of the plate 104 are described in the discussion of FIG. 6 and are incorporated here. Varying embodiments of the plate 104 include an interior surface 722. In one embodiment, the interior surface 722 is adapted to mate with the interior surface 522, illustrated in one embodiment in FIG. 5.

Various embodiment of the present subject matter include ridges 724. In various embodiments, ridges are used to allow particulates or fluid to pass between a circuit assembly mated to the plate 104. In various embodiments, air passes through the ridges and between a circuit assembly mated to the plate 104 to cool the circuit assembly.

Figure 8:
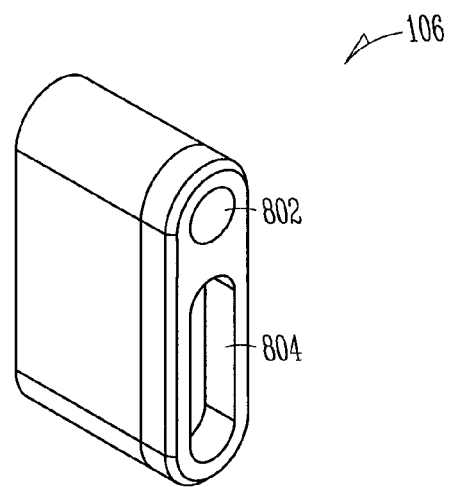
FIG. 8 illustrates a perspective view of a hinge, according to one embodiment of the present subject matter.

FIG. 8 illustrates a perspective view of a hinge 106, in one embodiment of the present subject matter. In varying embodiments, a circuit carrying assembly includes at least one hinge 106. In some examples, a circuit carrying assembly includes two hinges 106. Varying embodiments use other numbers of hinges.

In varying embodiments, a hinge 106 includes a socket 802 and a socket slot 804. In various embodiments, the slot 802 is adapted to mate to compatible features on a plate. In various embodiments, the fit between a plate and the socket 802 is free, and in others it is an interference fit, and it still others, it is tuned to provide a desired level of friction. Varying embodiments also include features in the socket which allow the adjustment of the hinge 106 to the plate in measured increments. For example, in some embodiments, the socket 802 includes at least one recess, and the mating feature on a plate includes at least one raised feature compatible with each recess, such that rotation of the hinge 106 requires the hinge 106 or plate or both to elastically deform whenever the feature of the plate is not mated with a recess in the socket. This elastic deformation, in various embodiments, compels the hinge 106 to come to rest in a position where the at least one raised feature on the plate mate with a recess, in order to relieve elastic deformation. The overall result of using recesses in the socket 802, in various embodiments, enables predetermined incremental adjustment.

In various embodiments, the hinge 106 includes a socket slot 804. Varying embodiments of the socket slot are adapted to mate to a feature on a plate. For example, in some embodiments, a plate includes a boss which can deform to allow the installation of a hinge 106. Varying embodiments of the hinge 106 are adapted to mate with a cylindrical boss. Mating the socket slot 804 with a cylindrical boss allows, in various embodiments, the hinge 106 to posses two substantial degrees of freedom; one being rotation of the hinge 106 around a mating boss, and another being an ability to slide the hinge 106 relative to the position of a mating feature. Varying embodiments of a circuit assembly carrier incorporating the socket slot 804 can accommodate manufacturing variance in dimensional tolerances as well as any dimensional variance which occurs due to heating. In various embodiments, the fit between a plate and the socket slot 804 is free, and in others it is an interference fit, and it still others, it is tuned to provide a desired level of friction.

Additionally, various embodiments of the hinge 106 enable connection of two plates, one to a socket 802, and one to a socket slot 804. Some examples of this assembly allow the two plates to be mated in a variety of ways. For example, in one embodiment, two plates may have a first set of major surfaces which mate, and, after being manipulated relative to the hinge 106, can mate the surfaces opposed to the first set of major surfaces. Additionally, in some embodiments, one plate may not be able to rotate approximately 180 degrees relative to the hinge 106, and as such, can rest angled to the plane of the other plate.

These are just examples of various embodiments of a hinge 106 with a socket 802 and a socket slot 804, and these descriptions are not intended to be a complete list of the embodiments within the scope of the present subject matter. For example, in some embodiments, the hinge contains a boss, and the plates contain sockets. Various combinations of hinges and bosses are also within the scope of the present subject matter.

In various embodiments, the hinge 106 is plastic. However, it should be noted that other embodiments not enumerated here fall within the scope of the present subject matter.

Figure 9:
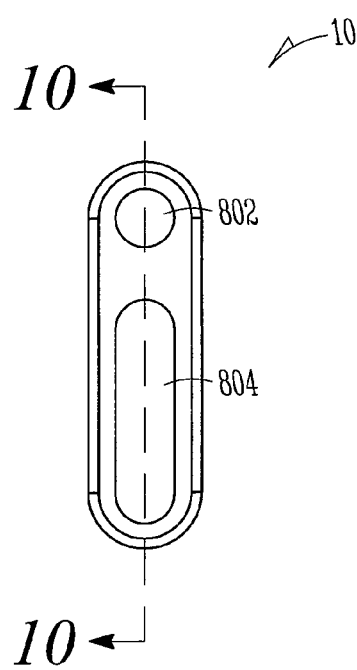
FIG. 9 illustrates a side view of a hinge, according to one embodiment of the present subject matter.

FIG. 9 illustrates a side view of a hinge 106, in one embodiment of the present subject matter. The hinge 106 includes a socket 802 and a socket slot 804, and further indicates a cross section illustrated in FIG. 10.

Figure 10:
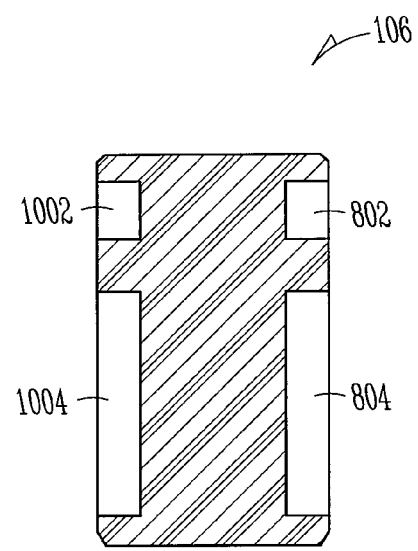
FIG. 10 illustrates a front view of a cross section of the hinge pictured in FIG. 9, according to one embodiment of the present subject matter.

FIG. 10 illustrates a front view of a cross section of the hinge 106 pictured in FIG. 9, in one embodiment of the present subject matter. The hinge 106 includes a socket 802 and a socket slot 804. Additionally, in various embodiments, hinge includes a second socket 1002, and a second socket slot 1004. The cross section is offered to show that, for example, in one embodiment, the hinge includes material between the socket 802 and the second socket 1002. However, in various embodiments, the socket 802 and the socket slot 1002 are connected by a common passage.

Figure 11:
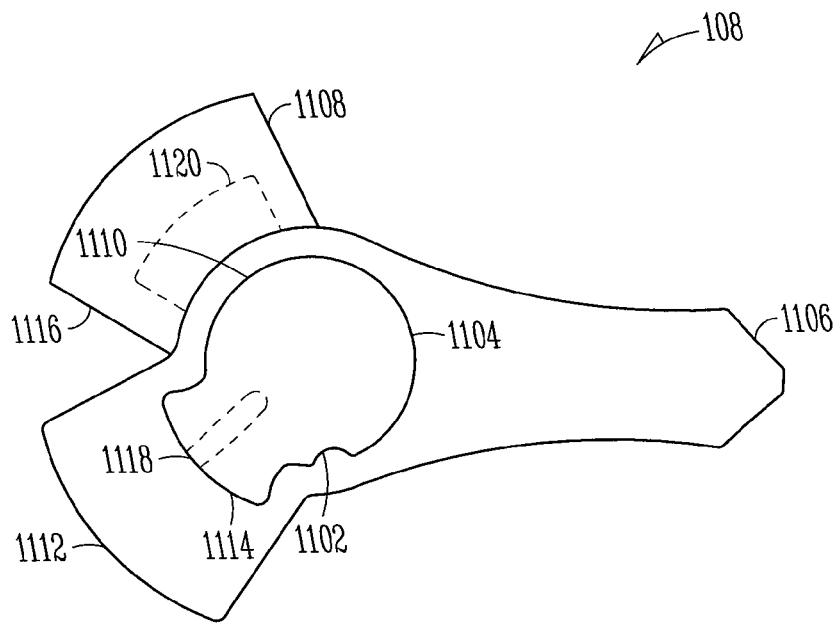
FIG. 11 illustrates a top view of a hold-down, according to one embodiment of the present subject matter.

FIG. 11 illustrates a top view of a hold-down 108, in one embodiment of the present subject matter. Various embodiments of a hold-down 108 are attached to a plate, and varying embodiments partially enable interlocking a circuit assembly to a plate.

In varying embodiments, the hold-down 108 includes a barrel-shaped primary structure 1104, attached to which are a first key 1114, a second key 1112, a third key 1108, and a fourth key 1120 (hidden view). Further, in some embodiments, an elongated handle 1106 is attached to enable the hold-down 108 to be manipulated. In some embodiments, the barrel shaped primary structure 1104 is approximately cylindrical, and includes an approximately uniform diameter. Varying embodiments include a primary structure 1104 which includes more than one diameter. Some embodiments of the primary structure 1104 are not cylindrical. For example, in some examples, the barrel shaped primary structure 1104 is oval. Still other embodiments are cube shaped. It should be noted that the recitations here do not provide a complete list, and are offered only as an illustration. Embodiments not listed here fall within the scope of the present subject matter.

Varying embodiments of the present structure are adapted to mate with a circuit assembly carrier. For example, in one embodiment, a plate includes an interface adapted to mate to the circuit hold-down 108. Varying embodiments of a plate include keyed access, and in some embodiments, the keyed access is adapted to constrain the hold-down 108 following manipulation of the hold-down 108 after insertion. For example, in one embodiment, a keyed hold-down 108 adapted for rotary manipulation is aligned with and inserted into a keyed access in a circuit carrier, and an associated interface. In one embodiment, key 1114 is positioned to permit inserting the hold-down 108 into a circuit carrier interface which includes an opening shaped similar to the profile created by the approximate combination of the primary structure 1104 and the key 1114, as illustrated in FIG. 11. However, other key shapes fall within the scope of the present subject matter, and it should be understood that those enumerated here are offered only as illustration of one embodiment of the present subject matter. Varying examples use key 1112 to interlock a circuit assembly.

Once inserted, in various embodiments, a hold-down 108 may be rotated, such that the key passes into recesses located within the interface, putting the key out of alignment with the opening in the circuit carrier. Because the key is out of alignment with the circuit carrier, in various embodiments, the hold-down 108 in substantially constrained from separation from the plate. However, in embodiments which include recesses adapted for rotation, the hold-down 108 may continue to be manipulated in a rotary motion, without providing for the removal of the hold-down 108 from the interface. In some embodiments, features are available which prevent the hold-down 108 from realigning with the openings, and providing for removal.

For example, in varying embodiments, once rotated, features in the hold-down 108 and circuit carrier assembly prevent extraction of the hold-down 108. Various embodiments include features which require that the hold-down 108 be forced past a locking feature which resists rotary movement. In other words, in one embodiment, a user must exert an initial force which is greater than the force normally required rotate an installed hold-down 108, in order to position the hold-down 108 past a locking position and into a normal-use position. In one embodiment, a raised portion 1118 on the key 1114 must pass a mating feature in the interface, and the initial force required by the user moves the raised portion past a mating feature. In various examples, once the raised portion is rotated past a mating feature, the hold-down 108 may be manipulated by normal forces. Overall, these embodiments include locking features which resist manipulation of the raised portion 1118 past its mating feature, but otherwise allow movement of the hold-down 108.

In various embodiments, features of the first plate and features of the second plate are located such that when the two plates are mated, the features are aligned, so that a hold-down can mate with the first plate or the second plate without substantially changing the location of its center axis.

Various embodiments of the present subject matter include identification markings which can assist in the use of a hold-down 108. For example, first marking 1102 can be aligned with a mating feature to communicate information to a user, such as position. For example, marking "A" indicates attachment to the first plate, and marking "B" indicates attachment to the second plate, and marking 1102 can be used to indicate whether the hold-down is aligned with "A" or "B". In various embodiments, the first marking 1102 is adapted for use in optical systems which inspect the hold-down 108 position and communicate position information to other areas of a manufacturing process. Similarly, a second marking 1110, also communicates information to other process components.

In various embodiments, a circuit carrier includes a first plate mated to a second plate and two hold-downs. In such embodiments, the plate cannot be separated unless each hold-down is positioned correctly, as indicated by the marking 1102. One benefit of a design which requires that two hold-downs be coordinated is that the first hold-down may not be manipulated to interlock the circuit assembly to one plate, while the second hold-down is manipulated to interlock the circuit assembly to the second plate, thereby imparting a stress on the circuit assembly when the plates are separated. Additional embodiments use an external link to connect two hold-downs to ensure they are in a coordinated position.

In various embodiments, the elongated handle 1106 is sized to provide for rotary manipulation of the hold-down 108 with a user's finger. In examples designed for finger use, various features are included, such as a concave shape including a radius compatible with a fingertip. Varying embodiments also include textures which are easy to grasp. Still further embodiments include other features, like raised bumps or ridges.

Various embodiment of the elongated handle also include features which are adapted to work with process machinery. For example, in various embodiments, a handle is attached to the hold-down 108 which allows a machine to interface with the hold-down 108 and rotate it. Various embodiments of a handle might include optical markings, or other features suited to enable a machine to locate and manipulate the hold-down 108.

In varying embodiments of the present subject matter, once the hold-down 108 is inserted into an interface, it is rotated. Varying embodiments include chamfers 1116 which round the edges of the hold-down keys to enhanced rotation. In various embodiments, rounded edges include less sharp elements which can catch on portions of a plate.

In various embodiments, the hold-down 108 is plastic. However, it should be noted that other embodiments not enumerated here fall within the scope of the present subject matter.

Figure 12A:
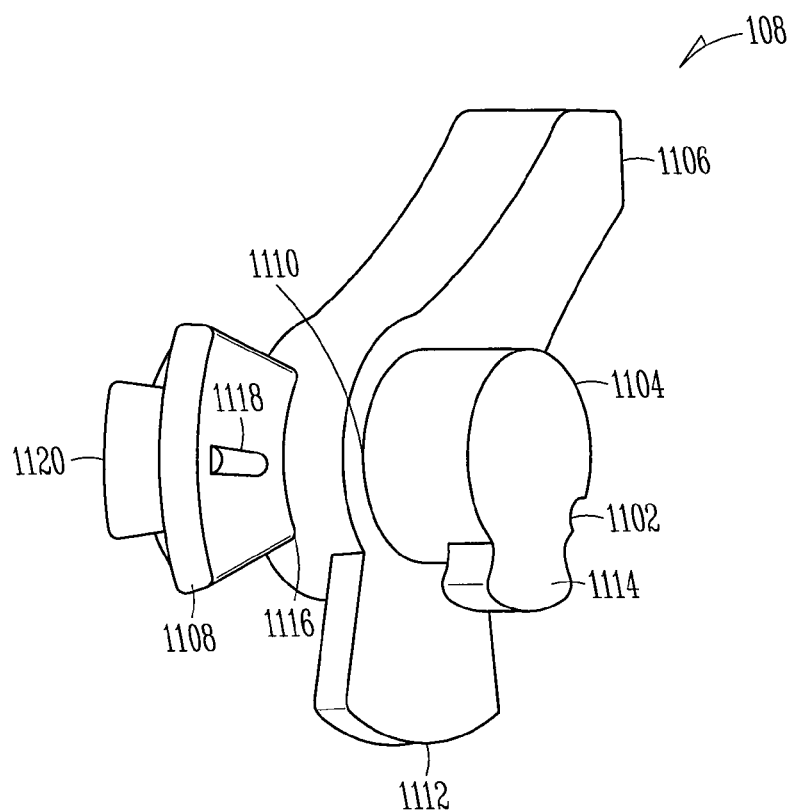
FIG. 12A illustrates a perspective view of a hold-down, according to one embodiment of the present subject matter.

FIG. 12A illustrates a perspective view of a hold-down 108, in one embodiment of the present subject matter. The hold-down 108 is similar to the embodiment illustrated in FIG. 11, and various features of that discussion are incorporated into this discussion. For example, the hold-down 108 includes a marking feature 1102, a primary structure 1104, an elongated handle 1106, a key 1108, a second marking feature 1110, a second key 1112, a first circuit interface key 1114, chamfers 1116, a locking feature 1118, and a second circuit interface key 1120.

Figure 12B:
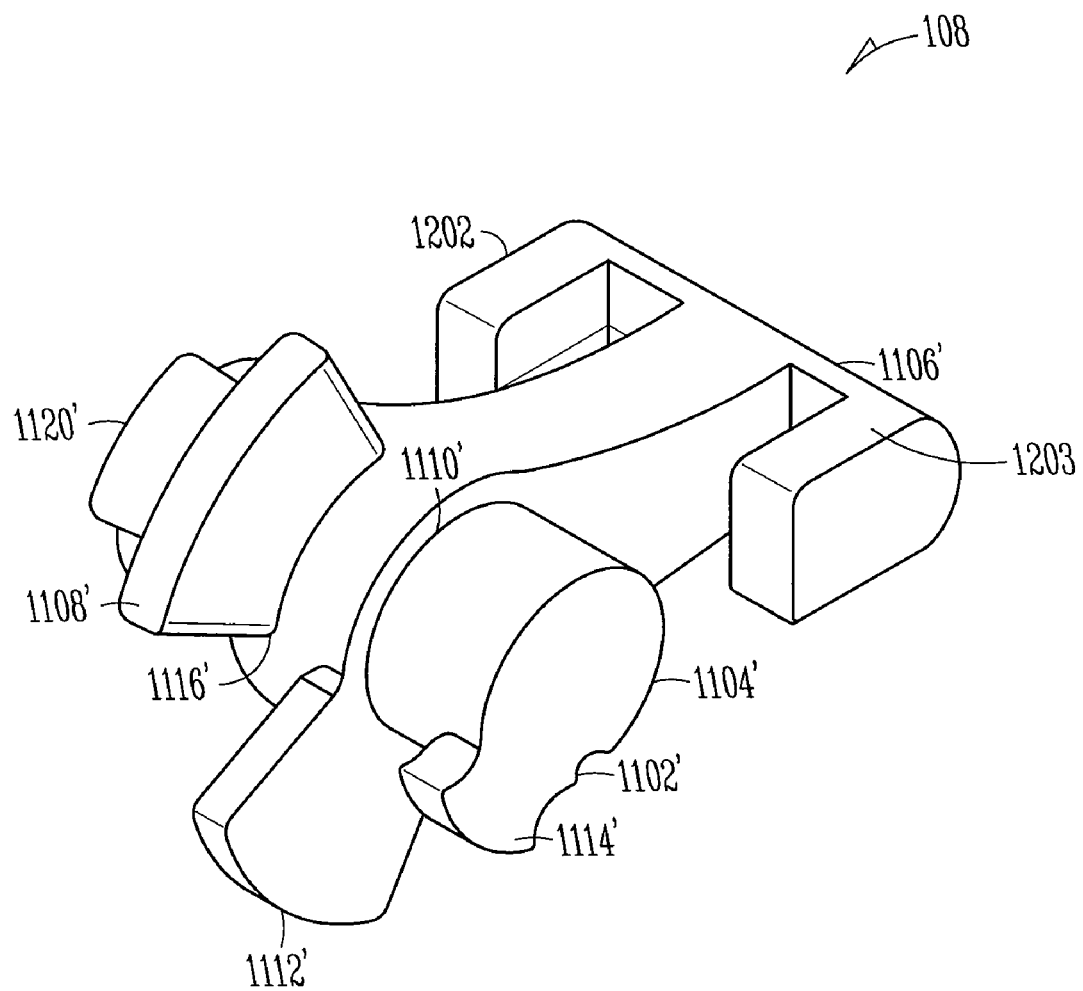
FIG. 12B illustrates a perspective view of a hold-down with an optional shape, according to one embodiment of the present subject matter.

FIG. 12B illustrates a perspective view of a hold-down 108, in one embodiment of the present subject matter. The hold-down includes first stop 1202, and a second stop 1203. One or both of either the first stop 1202 or the second stop 1203 are useful for distributing fingertip pressure, in various embodiments. Additionally, one or both of the first stop 1202 and the second stop 1203 are useful for limiting rotational movement in a circuit carrier, in various embodiments. The hold-down 108 is similar to the embodiment illustrated in FIG. 11, and various features of that discussion are incorporated into this discussion. The hold-down 108 includes a marking feature 1102', a primary structure 1104', an elongated handle 1106', a key 1108', a second marking feature 1110', a second key 1112', a first circuit interface key 1114', chamfers 1116', and a second circuit interface key 1120'.

Figure 13:
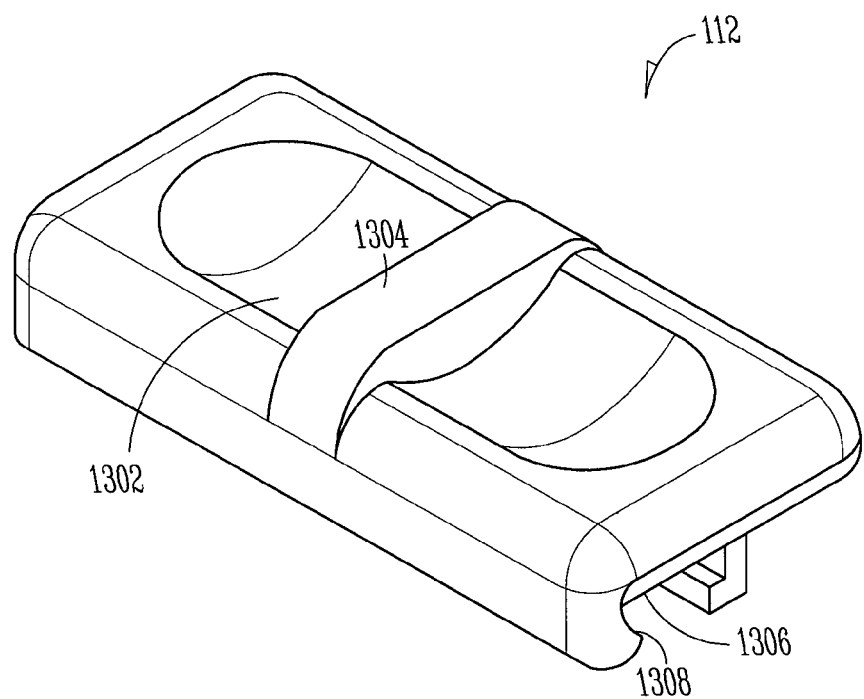
FIG. 13 illustrates a perspective view of the top of a clasp, according to one embodiment of the present subject matter.

FIG. 13 illustrates a perspective view of the top of a clasp 112, or sliding lock, in one embodiment of the present subject matter. Varying embodiments of the carrier of the present subject matter include at least one clasp. For example, in varying embodiments, the clasps are attached to a plate in a manner which resists disconnecting the clasp from the plate, but allows the clasp to be manipulated to both lock and unlock the clasp, which secures, or releases, respectfully, the plates of the circuit carrier from their mated position. In one embodiment, the circuit carrier 100 pictured in FIG. 1 includes two clasps.

One embodiment of the present subject matter includes a depression 1302 adapted to mate with a person's finger and provide a surface contour which resists finger movement. In other words, a finger pushing against a depression 1302 can move the clasp. In various embodiments, the claps includes a raised feature 1304 which also resists finger movement, such that a force applied by a finger moves the clasp. Some embodiment include rounded contours which assist a user in grasping the clasp. For example, if the clasp were not rounded, touching it could cause an operator pain.

It should be noted that in various embodiments other features can be present on the surface of the clasp. For example, in one embodiment, a feature is present and available as a means to enable a machine to mate with the clasp and move the clasp. Further, in some embodiments, the clasp includes features which allow optical devices, such as cameras, to record the location of the clasp and ensure that the clasp is in a proper position. One embodiment includes features adapted to allow finger movement, machine movement, and optical detection of clasp position.

Various embodiments of the clasp include a feature which allows attaching the clasp to a plate in a semi-permanent way. For example, in one embodiment, the clasp includes a first channel 1306 adapted for mating with a plate. In various embodiments, the first channel 1306 includes at least one tine 1308 which may be deformed, in combination with deformation of the clasp, as the clasp is attached to a plate. Some examples feature elastic deformation. Varying examples allow the clasp to resume its normal, non-elastically deformed state after it is connected to the plate.

In various embodiments, the first channel 1306 is sized larger than the mating feature on a plate, such that the clasp may slide freely along the plate. In further embodiments, the fit between the clasp and a plate is tuned to add friction, or force the clasp or plate to deform during manipulation, such that the clasp is not free to move, but rather requires at least some force to undergo movement. In one embodiment, the mating surface on the plate includes a series of features which allows for a variable resistance to movement as the clasp is manipulated. For example, in one embodiment, by varying the interface between the first channel 1306 and a plate, the clasp mechanism may provide feedback through an operator's manipulation of the clasp. Feedback is useful, in varying embodiments, for indicating position of the clasp relative to the plate. For example, feedback can be used to communicate to an operator that the clasp is fully constraining two plates, is not constraining two plates at all, or is somewhere in between these two parameters.

In various embodiments, the clasp is molded out of plastic. In other embodiments, the clasp is made from metal. Various embodiments provide for a clasp which is composed of other materials not enumerated here. Further, in various embodiments, the clasp is provided with surface texture which causes fricative resistance with other surfaces which contact it.

Figure 14:
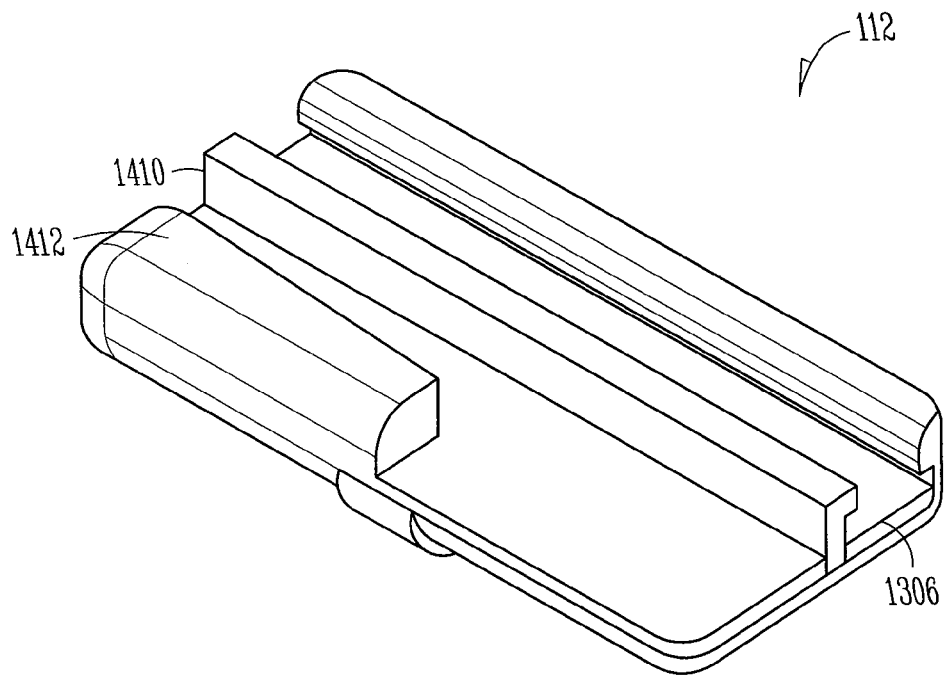
FIG. 14 illustrates a perspective view of the bottom of a clasp, according to one embodiment of the present subject matter.

FIG. 14 illustrates a perspective view of the bottom of a clasp 112, in one embodiment of the present subject matter. In various embodiments, a clasp includes a first channel 1306, as discussed above in description related to FIG. 13. Varying embodiments of the clasp also include a second channel 1410. In part, the second channel 1410 may be formed by including a raised portion 1412, in various embodiments. For example, in some embodiments, a first channel 1306 provides a means for mating the clasp to one plate, and a second channel provides the means for mating the clasp to a second plate.

In one embodiment, the second channel may be shaped such that the movement of the clasp relative to plate features adapted to mate to the second channel 1410 causes the clasp to require increasing force as it is moved. For example, in one embodiment, the second channel 1410 can include a taper, and a mating feature a raised portion, such that as the clasp requires increasingly more force as the taper slides past the raised portion. In varying embodiments, the taper can also include a relief, such that upon sliding the clasp a set distance, a raised feature in the mating plate is provided a relief. The net effect of such an embodiment is both that a feedback is provided to the user which indicates that the clasp is in proper position, and that a raised feature mated with a relief provides a lock which resists further movement of the clasp.

In various embodiments, any friction between the clasp 112 and a plate is provided by either surface friction, or a combination of surface friction and deformation of the clasp and/or plate. Various embodiments also employ varying features to induce friction, such as lubricants of a tuned lubricity which, when deposited between the clasp and a plate, resist movement of the clasp relative to the plate.

Figure 15:
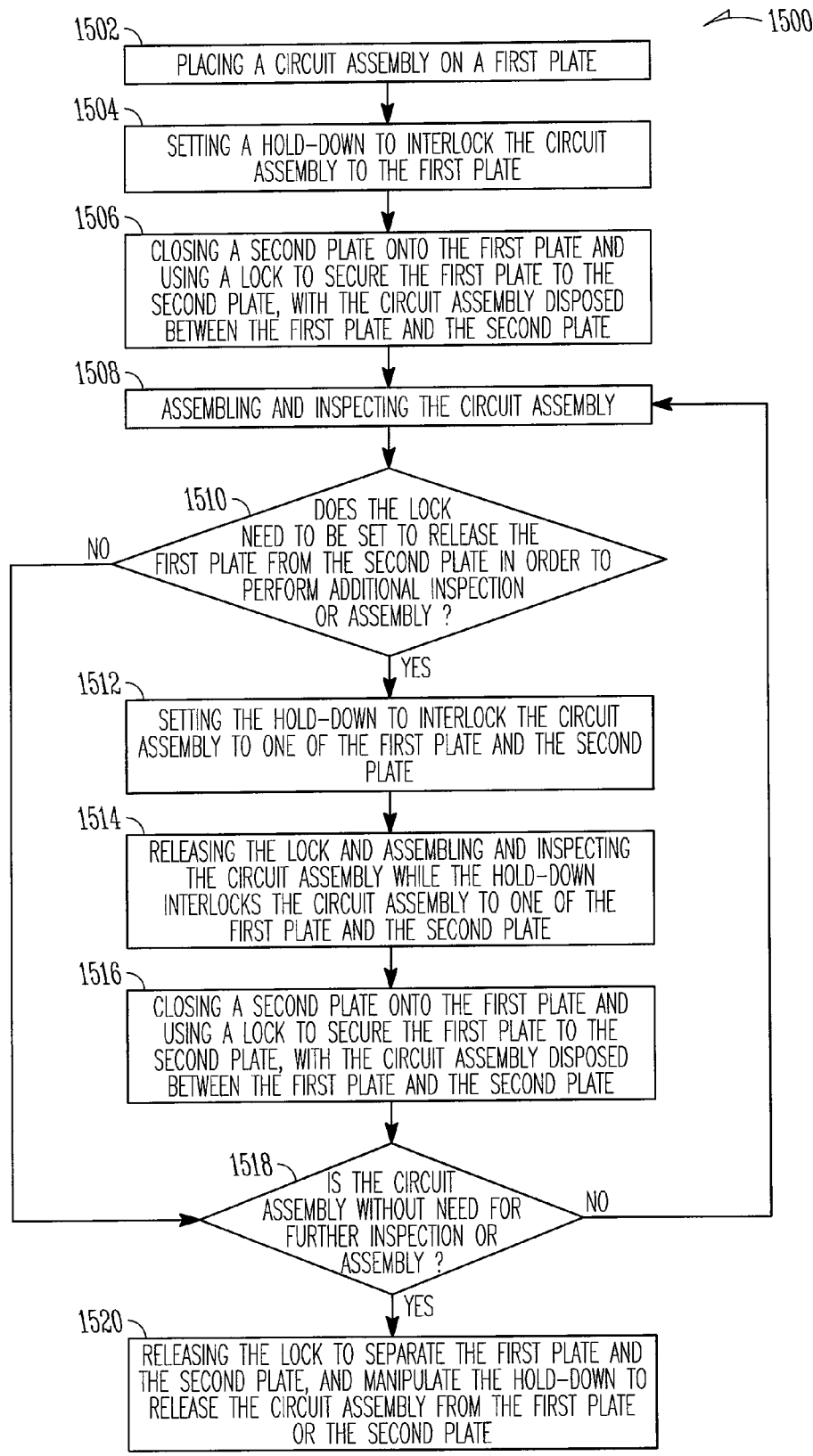
FIG. 15 illustrates a method of holding a circuit assembly, according to one embodiment of the present subject matter.

FIG. 15 illustrates a method 1500 for using a circuit carrier, in one embodiment of the present subject matter. In various embodiments, a circuit assembly is placed on a first plate 1502. In some examples, a hold-down is used to interlock the circuit assembly to the first plate 1504. Varying embodiments close the second plate onto the first plate and use a lock or clasp to secure the first plate to the second plate, with the circuit assembly being disposed between the first plate and the second plate 1506. In some embodiments, when the first plate and the second plate are secured with a circuit assembly disposed between them, assembly and inspection procedures are performed on the circuit assembly 1508. Varying embodiments require a process to decide whether it would be helpful to use the lock to release the first plate from the second plate in order to perform additional inspection or assembly 1510. In embodiments which do not require using the lock to release the first plate from the second plate in order to perform additional inspection or assembly 1510, the process inquires whether the circuit assembly requires any further assembly and inspection 1518. In one example, further assembly and inspection includes using apertures in the plate to inspect the circuit assembly. If the circuit assembly does not require additional assembly and inspection, the circuit assembly may be released from the circuit carrier 1520.

In embodiments including additional assembly and inspection 1510, a hold-down is set to interlock the circuit assembly to one of a group including the first plate and the second plate 1512. Additionally, in some embodiments, the lock may be released to allow assembly and inspection of the circuit assembly 1514. By allowing the process to choose to interlock the circuit assembly to either the first plate or the second plate, the process can inspect both sides of a circuit assembly without separating the circuit assembly from the circuit carrier.

Once any assembly and inspection is performed on the circuit assembly, the lock is set to secure the first plate to the second plate, with a circuit assembly disposed between them 1516, in various embodiments of the present subject matter. Varying embodiments then use the process to decide whether the circuit assembly needs additional assembly and inspection 1518. In embodiments where it does, the process returns to a state where assembly and inspection are performed 1508. In embodiments where it does not, the process releases the circuit assembly from the circuit carrier 1520, for use by other processes.

Figure 16:
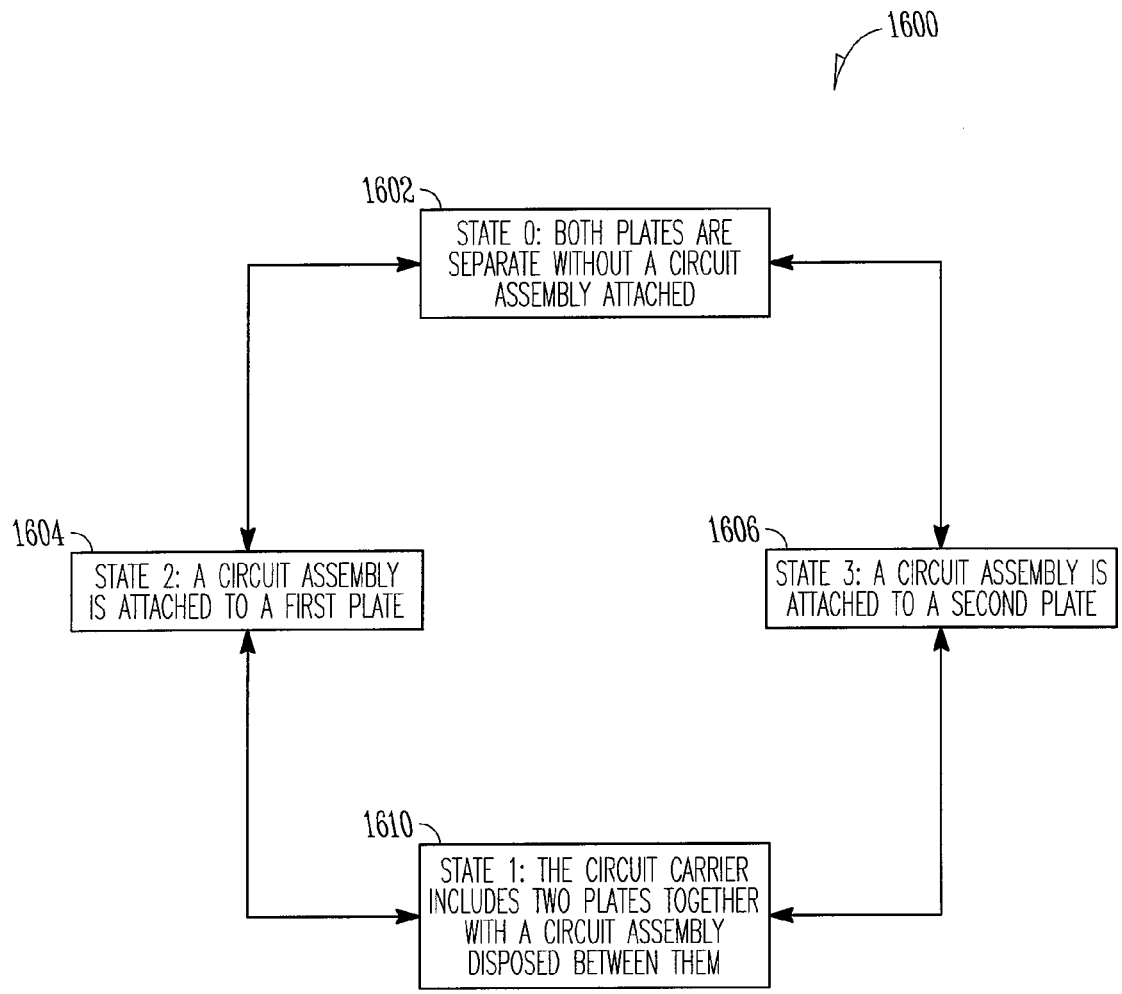
FIG. 16 illustrates a method of holding a circuit assembly, according to one embodiment of the present subject matter.

FIG. 16 illustrates a method 1600 of holding a circuit assembly, according to one embodiment of the present subject matter. For example, block 1602 represent a zero state which includes a circuit carrier with a first plate and a second plate, attached by a hinge. In various embodiments, the first and second plates are not mated in together in block 1602. In block 1604, in various embodiments of the present subject matter, the first and second plates are not mated in state 2. However, in block 1604, a circuit assembly is attached to a first plate. In various embodiments, a circuit assembly is interlocked to the first plate with a hold-down. Block 1606 includes state 3, in which the circuit assembly is attached to a second plate in state 3. In various embodiments, in state 3, the circuit assembly is attached to the second plate using a hold-down. State 1 of block 1610 includes a mated first and second plate, with a circuit assembly disposed between the first and second plate. In various embodiments, in state 1, the plates are locked together with a clasp or other type of mechanism which secures the first plate to the second plate.

In various embodiments, through the course of circuit assembly and inspection, the method which traverses states 0-3, according to method 1600, is useful for manipulating the circuit carrier and the circuit assembly. For example, in one embodiment, a user can move from block 1602, to block 1604 to inspect a first side of a plate, to block 1603 to manipulate a hold-down to release the circuit assembly from being interlocked to the first plate, and to interlock the circuit assembly to the second plate, and then to block 1606, to inspect a second side of the circuit assembly. Various other combinations of the steps of method 1600 are within the scope of the present subject matter, and the description here, used for illustration, should not be interpreted as limiting.

Although specific embodiments have been illustrated and described herein, it will be appreciated by those of ordinary skill in the art that any arrangement which is calculated to achieve the same purpose may be substituted for the specific embodiment shown. This application is intended to cover adaptations or variations of the present subject matter. It is to be understood that the above description is intended to be illustrative, and not restrictive. Combinations of the above embodiments and other embodiments will be apparent to those of skill in the art upon reviewing the above description. The scope of the present subject matter should be determined with reference to the appended claims, along with the full scope of equivalents to which such claims are entitled.

What is claimed is:

1. A method for carrying a circuit assembly with a first side and a second side with a circuit carrier, the method comprising:
   connecting a first plate of the circuit carrier to a second plate of the circuit carrier with a hinge;
   using the first plate to hold the first side of the circuit assembly using a hold-down to interlock the circuit assembly to the first plate in a first mode of operation;
   using the hold-down to release the circuit assembly from the first plate and to interlock the circuit assembly to the second plate in a second mode of operation other than the first mode of operation; and
   mating the first plate and the second plate and using a lock to secure the first plate to the second plate in a first state of operation, and to release the second plate from the first plate in a second state of operation that includes interlocking the circuit assembly to the first plate using the hold-down in the first mode of operation and interlocking the circuit assembly to the second plate using the hold-down in the second mode of operation.

2. The method of claim 1, wherein the circuit carrier includes a first hold-down and a second hold-down.

3. The method of claim 2, wherein the first hold-down and the second hold-down secure the first plate to the second plate in a first configuration, and release the first plate from the second plate in a second configuration.

4. The method of claim 2, wherein markings are used to coordinate the position of the first hold-down and the second hold-down.

5. The method of claim 1, further comprising, in the first mode of operation, flexing the circuit assembly by bending a flexible portion of the circuit assembly.

6. The method of claim 1, further comprising rotating the first plate at least approximately 175 degrees in relation to the hinge and the second plate at least approximately 175 degrees in relation to the hinge.

7. The method of claim 1, further comprising mating the first plate to the second plate during switching between the first mode and the second mode.

8. A method for carrying a circuit assembly with a first side and a second side with a circuit carrier, the method comprising:
connecting a first plate of the circuit carrier to a second plate of the circuit carrier with a hinge;
using the first plate to hold a first side of the circuit assembly using a hold-down to interlock the circuit assembly to the first plate in a first mode of operation;
using the hold-down to release the circuit assembly from the first plate and to interlock the circuit assembly to the second plate in a second mode of operation other than the first mode of operation;
mating the first plate and the second plate and using a lock to secure the first plate to the second plate in a first state of operation, and to release the second plate from the first plate in a second state of operation that includes interlocking the circuit assembly to the first plate using the hold-down in the first mode of operation and interlocking the circuit assembly to the second plate using the hold-down in the second mode of operation; and
carrying the circuit assembly in the circuit carrier in the first state of operation.

9. The method of claim 8, wherein carrying the circuit assembly in the circuit carrier includes carrying the circuit assembly in the second state of operation in the first mode.

10. The method of claim 8, wherein carrying the circuit assembly in the circuit carrier includes carrying the circuit assembly in the second state of operation in the second mode.

11. The method of claim 8, wherein the first mode of operation includes inspecting the first side of the circuit assembly facing that is away from the first plate.

12. The method of claim 11, wherein the second mode of operation includes inspecting the second side of the circuit assembly that is facing away from the second plate.

13. The method of claim 8, further comprising keying the hold-down to the first plate.

14. The method of claim 13, further comprising releasably locking the hold-down in a first position associated with the first mode of operation, and into a second position associated with a second mode of operation.

15. A method for carrying a circuit assembly with a first side and a second side with a circuit carrier, the method comprising:
connecting a first plate of the circuit carrier to a second plate of the circuit carrier with a hinge;
using the first plate to hold a first side of the circuit assembly using a hold-down to interlock the circuit assembly to the first plate in a first mode of operation;
using the hold-down to release the circuit assembly from the first plate and to interlock the circuit assembly to the second plate in a second mode of operation other than the first mode of operation; and
mating the first plate and the second plate and using a lock to secure the first plate to the second plate in a first state of operation by sliding the lock such that the lock is releasably locked into a locked position, and to release the second plate from the first plate in a second state of operation that includes interlocking the circuit assembly to the first plate using the hold-down in the first mode of operation and interlocking the circuit assembly to the second plate using the hold-down in the second mode of operation.

16. The method of claim 15, further comprising aligning the circuit assembly with the first plate and exposing a portion of the circuit assembly through an aperture in the first plate.

17. The method of claim 15, wherein the hold-down is a first hold-down, and further comprising, in the first mode of operation, interlocking the circuit assembly to the first plate with the first hold-down and with a second hold-down, and in the second mode of operation interlocking the circuit assembly to the second plate with the first hold down and the second hold down.

18. The method of claim 17, wherein the first hold-down and the second hold-down secure the first plate to the second plate in a first configuration, and release the first plate from the second plate in a second configuration.

19. The method of claim 18, further comprising coordinating the position of the first hold-down and the second hold down by aligning the first hold-down with a first indicia, and the second hold-down with a second indicia.

20. The method of claim 19, wherein the first indicia and the second indicia provide substantially the same visual indicia.

* * * * *